United States Patent [19]

Khatri et al.

[11] Patent Number: 5,408,131
[45] Date of Patent: Apr. 18, 1995

[54] CIRCUIT IDENTIFIER FOR USE WITH FOCUSED ION BEAM EQUIPMENT

[75] Inventors: Sunil P. Khatri, Austin; Renny L. Eisele, Manchaca, both of Tex.

[73] Assignee: Motorola, Inc., Schaumburg, Ill.

[21] Appl. No.: 871,181

[22] Filed: Apr. 20, 1992

[51] Int. Cl.[6] ............................................. H01L 27/02
[52] U.S. Cl. .................................... 257/797; 257/798; 257/48
[58] Field of Search ........................... 257/797, 798, 48

[56] References Cited

U.S. PATENT DOCUMENTS 4,343,877  8/1982  Chiang ..................................... 257/48

FOREIGN PATENT DOCUMENTS 0113462  5/1987  Japan ..................................... 257/798
0133517  6/1988  Japan ..................................... 257/797

Primary Examiner—Mark V. Prenty
Attorney, Agent, or Firm—Keith E. Witek

[57] ABSTRACT

A circuit die (10) has circuit modules (12a-12f). Adjacent the circuit modules (12a-12f) is a plurality of redundant circuits regions (14a-14i). Each of the redundant circuit regions (14a-14i) has one or more redundant circuits, such as redundant circuits (16k-16n). The redundant circuits (16k-16n) are identified and oriented via one of a binary, a ternary, or a quaternary circuit identifier comprised of symbols, such as symbols (18, 24, 44, and 56). The symbols (18, 24, 44, and 56) are capable of being lithographically defined in a small surface area and therefore minimize the surface area consumed by the redundant circuits regions (14a-14i). The redundant circuits (16k-16n) are preferably used by focused ion beam (FIB) equipment to replace, repair, or supplement various electrically functional portions of the circuit modules (12a-12f).

18 Claims, 3 Drawing Sheets

CIRCUIT IDENTIFIER FOR USE WITH FOCUSED ION BEAM EQUIPMENT

FIELD OF THE INVENTION

The present invention relates generally to semiconductor technology, and more particularly, to semiconductors which use circuit identifiers.

BACKGROUND OF THE INVENTION

Most microprocessors, memory chips and related integrated circuits manufactured today are designed with millions of transistors. Therefore, the cost of designing and manufacturing microprocessors, memory chips, and the like is high. In addition, the number of human design errors and manufacturing errors are continually increasing due to added circuit and process complexity. Both the increased number of errors and high cost of manufacturing require that the testing of an integrated circuit be as complete and informative as possible.

In order to improve debugging and testing of an integrated circuit, redundant circuitry is designed into the integrated circuit. The redundant circuitry is usually in the form of small pieces of logic circuitry or circuits known as standard cells. The redundant circuitry is typically NAND gates, inverters, and the like. The redundant circuitry has metal pad input and metal pad output connections that are physically located close to a top passivated surface of the integrated circuit.

A focused ion beam (FIB) machine is commonly used to disconnect a damaged portion of the integrated circuit from the rest of the integrated circuit. Once the damaged portion of the integrated circuit is disconnected, the redundant circuitry is electrically connected by the FIB machine to the rest of the integrated circuit via metal conductors. The added redundant circuitry functionally replaces the damaged circuit in the integrated circuit. Further testing can be performed to further determine errors and functionality without using expensive redesign techniques, new mask formation steps, increased manufacturing, or the like.

The redundant circuitry is usually scattered throughout the integrated circuit and may be rotated to different orientations based on size and space constraints. Therefore, the identification of the redundant cells becomes difficult to ascertain. The difficulty is primarily due to overlying integrated circuit layers obscuring a human user's view of the redundant circuits. In addition, various small and indistinguishable internal features of the redundant circuitry and the fact that redundant circuits are spread throughout the integrated circuit further complicate redundant circuit identification.

Alphanumeric labels have been used to identify test structures which are used for process development and process characterization of an integrated circuit. Alphanumeric numerals are physically large and therefore not available for use in labeling redundant circuitry, which is typically limited by size constraints. In addition, poor visibility of test structures and labels results due to the existence of multiple device layers on an integrated circuit. Topography can also distort or reduce the visibility of circuit features. Therefore, redundant circuit features cannot be relied on to identify specific redundant circuits.

SUMMARY OF THE INVENTION

The previously mentioned disadvantages are overcome and other advantages achieved with the present invention. In one form, the present invention comprises a circuit identifier for use with focused ion beam equipment. An integrated circuit die has a plurality of vertical stacked device layers and various circuit modules arranged in a predetermined functional layout. A plurality of redundant circuits is distributed within the integrated circuit die. The plurality of redundant circuits are selectively functionally activated by the focused ion beam equipment to replace or supplement a predetermined portion of one of the circuit modules. Identification means is formed from a predetermined one of the device layers of the integrated circuit die for specifically identifying a functionality of a predetermined redundant circuit. The identification means is one of a binary, a ternary, or a quaternary numerically encoded label. The identification means also functions to identify to a viewer of the integrated circuit die a physical orientation of the predetermined redundant circuit.

The present invention will be more clearly understood from the detailed description below in conjunction with the accompanying drawings.

DESCRIPTION OF THE PREFERRED EMBODIMENT

Figure 1:
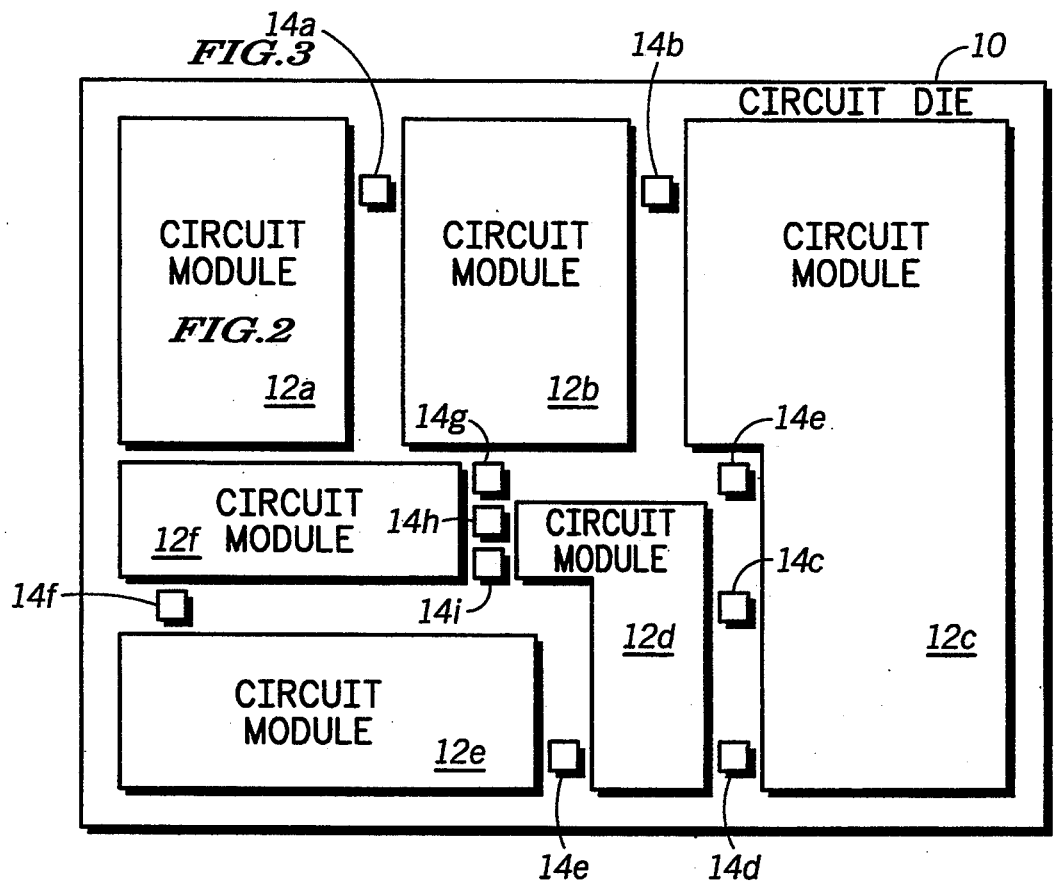
FIG. 1 illustrates in a top perspective view an integrated circuit die having redundant circuitry.

Illustrated in FIG. 1 is an integrated circuit die 10. The die 10 has a plurality of circuit modules 12a through 12f. The die 10 may be a microprocessor, a memory circuit, analog circuitry, or a like integrated circuit. Each of the circuit modules 12a through 12f may be either a CPU portion, a memory region, a decoder, output buffers, an analog-to-digital (A/D) or a digital-to-analog (D/A) converter circuit, a graphics unit, a floating point processor unit, a cache, an integer unit, a multiplier, a filter, or a like conventional integrated circuit module or functional block. It should be apparent that any number of functional blocks may exist on an integrated circuit. The circuit modules 12a through 12f are physically positioned within die 10 in a predetermined functional layout. It should also be apparent that other structures such as conductive buses, bonding pads, and the like are also present on the die 10, but are not specifically illustrated.

Between the circuit modules 12a through 12f, redundant circuit regions 14a through 14i are illustrated. Redundant circuit regions 14a through 14i are regions that contain either one or a plurality of redundant circuits, otherwise known as standard cells. Redundant circuits typically include NAND gates, NOR gates, inverters, latches, resistors, capacitors, or the like. The redundant circuits may vary in size, number of inputs, number of outputs, and functionality. Each of the redundant circuits is labeled with a binary, ternary, or quaternary identification code that provides for easy functional identification and physical orientation of a redundant circuit.

Once the die 10 is manufactured, testing of the die 10 is required. If various tests determine that a portion of a circuit module is defective, that defective portion of the circuit module is electrically disconnected from all other portions of die 10. Disconnection is performed via a focused ion beam (FIB) machine (not illustrated). Once disconnection is performed on the defective portion of the circuit module, either one or a plurality of redundant circuits is connected via the FIB machine to repair or supplement the circuit module. The binary, ternary, or quaternary identification code provides an easy way for a human user to locate, orient, identify, and electrically connect the redundant circuitry properly. Further testing can then be performed on the die 10.

In addition, the FIB machine may be used to connect redundant circuits to function for circuits missing from the die 10, misplaced on die 10, or the like. Therefore, redundant circuits may be used to supplement, alter, or add functionality to a circuit module of the die 10.

Figure 2:
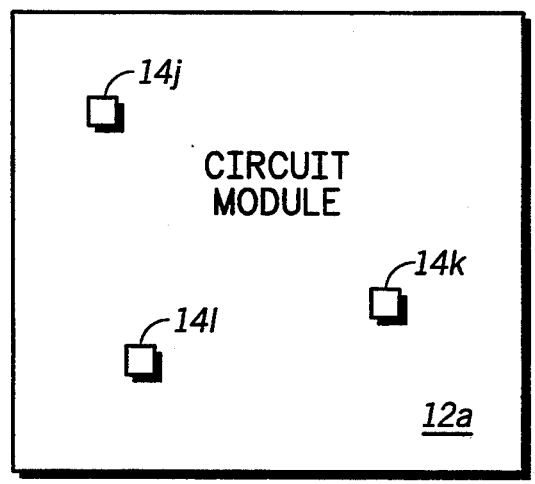
FIG. 2 illustrates in a top perspective view an integrated circuit module of FIG. 1 having redundant circuitry.

In FIG. 2, the circuit module 12a of FIG. 1 is illustrated. FIG. 2 is used to illustrate that groups of redundant circuit regions 14j, 14k, and 14l, are usually formed within the circuit modules 12a through 12f. Any circuit module 12a through 12f may contain one or a plurality of redundant circuit regions similar to regions 14j, 14k, and 14l.

Figure 3:
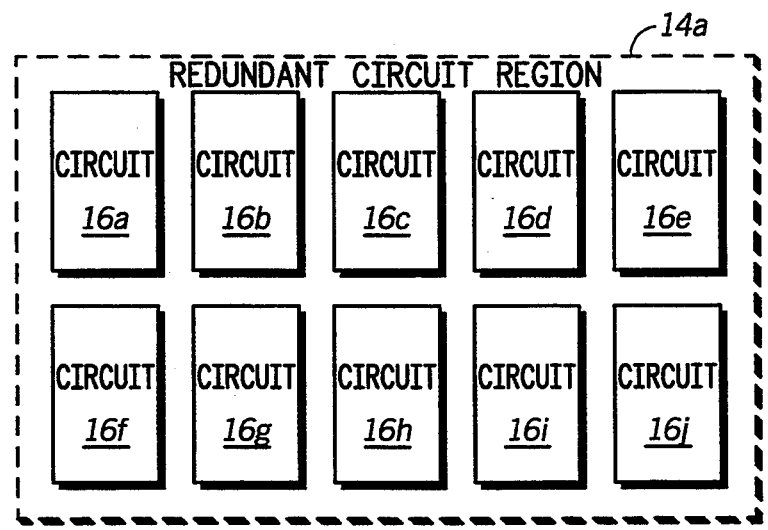
FIG. 3 illustrates in a top perspective view a portion of redundant circuitry of FIG. 1.

FIG. 3 illustrates the redundant circuit region 14a in greater detail. Redundant circuit region 14a may contain either one or a plurality of redundant circuits. In FIG. 3, redundant circuit region 14a has ten redundant circuits 16a through 16j. Each redundant circuit is labeled via a binary, ternary, or quaternary code to reduce surface area, identify the redundant circuit, and properly orient the redundant circuit for correct connection. The redundant circuits 16a through 16j can be arranged in any order or geometry.

Figure 4:
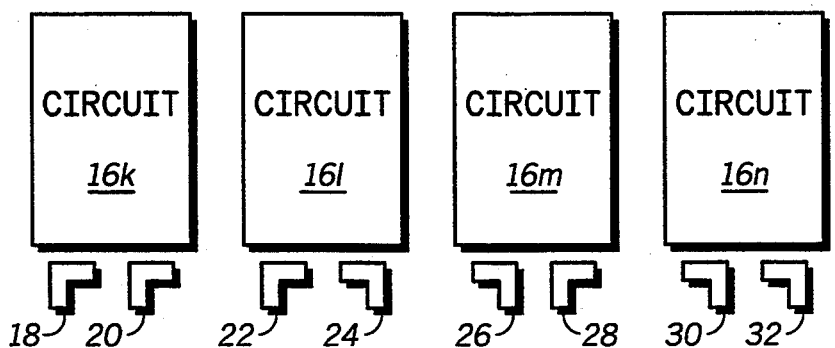
FIG. 4 illustrates in a top perspective view a binary set of circuit identifiers in accordance with the present invention.

FIG. 4 illustrates a binary method of labeling redundant cells or circuits. FIG. 4 illustrates four redundant circuits 16k through 16n. Redundant circuit 16k is labeled via symbols 18 and 20. Circuit 116l is labeled via symbols 22 and 24. Circuit 16m is labeled via symbols 26 and 28. Circuit 16n is labeled via symbols 30 and 32. The binary labeling method requires two distinct symbols. The symbols 18 through 32 in FIG. 4 are either a 180° rotated "L" symbol or a "T" symbol. One symbol represents a binary one and the other symbol represents a binary zero. For example, the 180° rotated "L" symbol is a binary one, and the "T" symbol is a binary zero, or vice versa.

If the rotated "L" symbol is a binary one, and the "T" symbol is a binary zero, circuit 16k is labeled as redundant circuit "00". Circuit 16l is labeled as redundant circuit "01". Circuit 16m is labeled as redundant circuit "10". Circuit 16n is labeled as redundant circuit "11". If circuit 16k is, for example, a NAND gate of a certain size and certain number of inputs, then all other identical NAND gate redundant circuits on the die 10 will have the same binary label "00" for identification. All identical redundant circuits can then be easily identified by a human user for focused ion beam connection. It should therefore be apparent that if all of the redundant circuits 16k through 16n are identical, then all the redundant circuits 16k through 16n have the same identification label.

The geometry of the symbols 18 through 32 is designed so that only one orientation is correctly read by a human user or equipment. All other orientations of symbols 18 through 32 are not capable of being read due to geometric differences. For example, if FIG. 4 is turned 90° in either direction, the symbols 18 through 32 are not in a horizontal line and therefore it can be determined that the redundant cell is not in a proper orientation. If the circuits 16k through 16n in FIG. 4 are rotated 180°, then the symbols 18 through 32, although positioned in a horizontal line, have different geometric shapes. Only one orientation, which is illustrated by FIG. 4 when held upright, is the proper redundant cell orientation. Therefore, a human user, operator, or engineer can easily identify input connection pads and output connection pads on redundant circuits without careful and tedious study of the redundant circuits under a microscope.

The binary symbols 18 through 32 and resulting binary labels are formed using minimum lithographic design rules and are therefore as small as a few square microns on average. The binary symbols 18 through 32 are formed via conventional masking, photolithographic patterning, etching, deposition, sputtering, or the like. The symbols 18 through 32 may be formed from a polysilicon layer, a metal layer, a like conductive material, or may be an etched depression in a dielectric material. Preferably, the symbols 18 through 32 are formed in an upper layer of metal so that a human operator can easily view the symbols 18 through 32.

Figure 5:
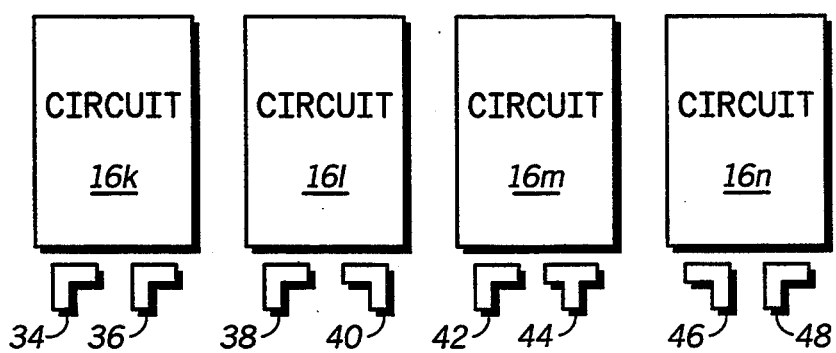
FIG. 5 illustrates in a top perspective view a ternary set of circuit identifiers in accordance with the present invention.

In FIG. 5 a ternary system of redundant circuit identification and orientation is illustrated. In FIG. 5 three distinct ternary symbols are used to label four redundant circuits 16k through 16n via symbols 34 through 48. Two symbols are identical to FIG. 4 and a third symbol is a "T" symbol. Therefore, circuit 16k is labeled as redundant circuit "00". Circuit 16l is labeled as redundant circuit "01". Circuit 16m is labeled as redundant circuit "02". Circuit 16n is labeled as redundant circuit "10". This method is similar to the labeling method illustrated in FIG. 4, but allows for the labeling of more cells with fewer symbols. The advantages of orientation, identification, and lithographic size discussed above for FIG. 4 also apply to the symbols 34 through 48 of FIG. 5.

Figure 6:
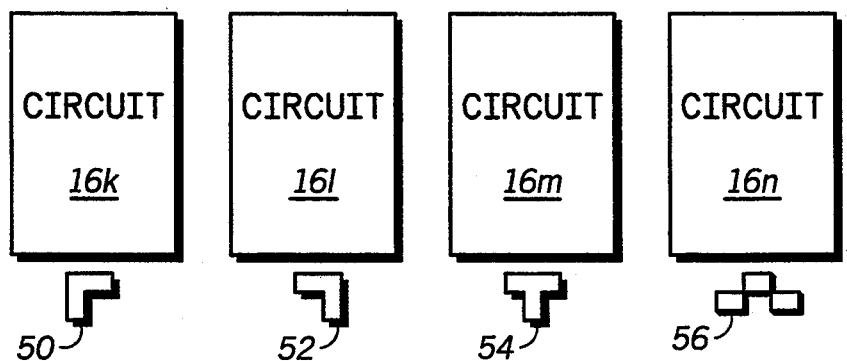
FIG. 6 illustrates in a top perspective view a quaternary set of circuit identifiers in accordance with the present invention.

In FIG. 6 a quaternary system of redundant circuit identification and orientation is illustrated. In FIG. 6 four distinct quaternary symbols are used to label four redundant circuits 16k through 16n via symbols 50 through 56. Three of the four symbols are identical to the symbols used in FIG. 5. A fourth symbol is an upside-down "V" symbol and indicates a fourth numeral. Therefore, circuit 16k is labeled as redundant circuit "0". Circuit 16l is labeled as redundant circuit "1". Circuit 16m is labeled as redundant circuit "2". Circuit 16n is labeled as redundant circuit "3". Subsequent different redundant circuits are sequentially labeled as "10", "11", "12", "13", "20", and so on. This method is similar to the labeling method illustrated in FIG. 5, but allows for the labeling of more cells with a fewer number of symbols. The advantages of orientation and size, discussed above for FIG. 4 and FIG. 5, also applies to the symbols 50 through 56 of FIG. 6.

Figure 7:
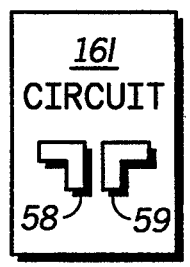
FIG. 7 illustrates in a top perspective view an alternative physical placement of a set of circuit identifiers in accordance with the present invention.

In most cases, an identification label for a redundant circuit is positioned outside a periphery of the redundant circuit as illustrated in FIGS. 4 through 6. In some cases, the identification label may be placed directly over redundant circuitry or active circuitry of die 10. In FIG. 7, redundant circuit 16l is used to illustrate a method of positioning labels over circuitry. The binary label "10", illustrated via symbols 58 and 59, is formed overlying the redundant circuit 116. Careful design and placement of the symbols 58 and 59 will avoid electrical short circuits that may occur when electrically connecting redundant circuit 16l for functional operation. In general, to avoid electrical short circuits, the symbols 58 and 59 should not be placed near or over any output or input bond pads of the redundant circuit 116.

Figure 8:
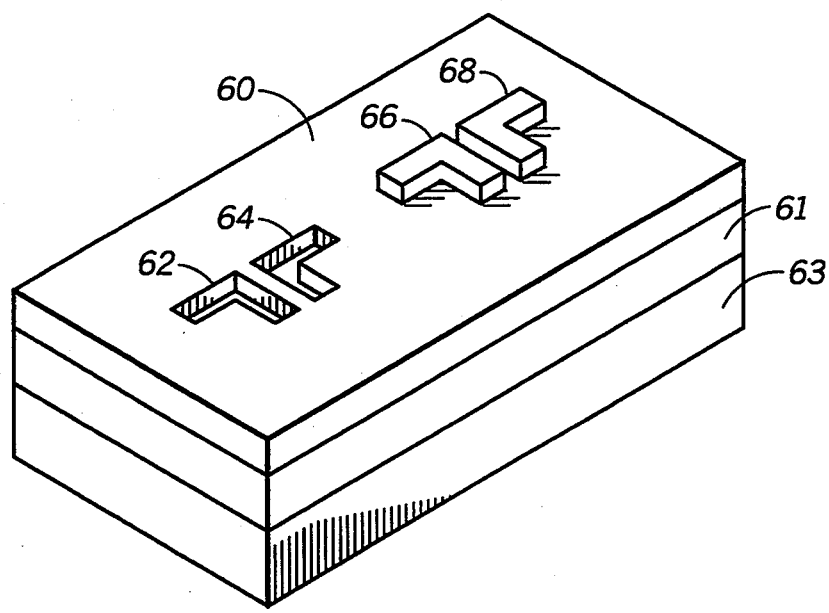
FIG. 8 illustrates in a three-dimensional perspective view a set of circuit identifiers in accordance with the present invention.

FIG. 8 illustrates in a three-dimensional top perspective view several symbols used by the inventive labeling method taught herein. FIG. 8 illustrates a first method and a second method of forming a redundant circuit label via various processing techniques. FIG. 8 illustrates a device layer 60 which is referred to as either a predetermined layer of material or a predetermined layer of an integrated circuit die. Layer 60 may be one of either a substrate material, a dielectric layer, a metal layer, a polysilicon layer, or a like integrated circuit layer. Preferably, the layer 60 is a dielectric layer.

The first method of forming a redundant circuit label from the predetermined layer 60 is illustrated via both a symbol 62 and a symbol 64. A semiconductor substrate 63 is provided. At least one device layer is formed overlying the substrate 63. In most cases, a plurality of device layers is formed overlying the substrate 63. The plurality of device layers is used to form circuit elements, circuit modules, redundant circuits, interconnections, isolation, and the like. The plurality of device layers is illustrated via a region 61. Overlying the region 61 is the layer 60. Together, symbols 62 and 64 form a binary label "10" as taught herein. The symbols 62 and 64 are formed by conventional masking, conventional lithographic patterning, and conventional etching of layer 60. Therefore, depression regions or trenches in layer 60 are formed as an identifier label.

A second method is illustrated in FIG. 8 via both a symbol 66 and a symbol 68. The second method is similar to the first method and is therefore not described in detail. A device layer of material (not illustrated) is formed overlying the layer 60. The symbols 66 and 68 are formed by conventional deposition, conventional photolithographic patterning, and conventional etching of the layer of material (not illustrated). The symbols 66 and 68 are vertically raised structures which overlie the layer 60 as illustrated. Either the first or second method discussed above may be used for circuit labeling.

Preferably, the labels taught herein should be as close to an integrated circuit semiconductor top surface as possible. Labels that are close to the integrated circuit semiconductor top surface are easy for a human user to view. Therefore, most labels are placed in an upper layer of metal, upper layer of polysilicon, an upper dielectric layer, a passivation layer, or the like. For best reading resolution, a top layer of metal or a top dielectric layer is used for labeling purposes.

In summary, presented herein is a binary, ternary, and quaternary labeling method for use with redundant circuits. Labeled redundant cells are electrically connected by FIB equipment to an integrated circuit to either repair circuit errors in an integrated circuit design or add to the functionality of an existing integrated circuit. The use of binary, ternary, or quaternary symbols allows for a labeling scheme that is less area intensive than conventional schemes. The area of a FIB-related redundant circuit is critical because FIB-related redundant circuits are placed within and/or between active circuit regions, circuit modules, and the like. In addition, the symbols used for labeling are designed so that the symbols properly read in only one orientation. Therefore, a redundant circuit can be properly identified, properly oriented, and electrically connected without error by properly reading the redundant circuit label.

While the present invention has been illustrated and described with reference to specific embodiments, further modifications and improvements will occur to those skilled in the art. For example, the inventive labeling method and corresponding labeling symbols taught herein can be used or formed in any semiconductor layer or on an integrated circuit. The geometric shapes of the symbols described herein may vary but will still serve the same identification and/or orientation purpose. In addition, the labels described herein may be assigned different numerical values or be assigned in a different rank order. For example, if a first symbol is defined to represent a "0" and a second symbol is defined to represent a "1", it should be apparent that the first and second symbol definitions may be reversed (i.e. the second symbol may be used to represent a "0" and the first symbol may be used to represent a "1"). The labeling method taught herein may be used to label other circuit structures such as circuit modules, test structures, critical circuit elements, bonding pads, inputs and outputs to circuits, conductors, buses, and the like. One label may be used to identify and orient a plurality of redundant circuits in order to further reduce circuit surface area. It is to be understood, therefore, that this invention is not limited to the particular forms illustrated and that it is intended in the appended claims to cover all modifications that do not depart from the spirit and scope of this invention.

We claim:

1. A circuit identifier for use with focused ion beam equipment comprising:
    an integrated circuit die having a plurality of layers and circuit modules arranged in a predetermined functional layout;
    a plurality of redundant circuits distributed within the integrated circuit die and which are selectively functionally activated by the focused ion beam equipment to replace or supplement a predetermined portion of one of the circuit modules; and
    identification means placed in close proximity to each one of the redundant circuits in the plurality of redundant circuits, the identification means being formed from a predetermined one of the layers of the integrated circuit die for specifically identifying a functionality of a predetermined redundant circuit, the identification means being one of a binary, a ternary, or a quaternary numerically encoded label which also functions to identify to a viewer of the integrated circuit die a physical orientation of the predetermined redundant circuit.

2. The circuit identifier of claim 1 wherein said predetermined one of the layers of the integrated circuit die is a layer of metal.

3. The circuit identifier of claim 2 wherein said layer of metal is one of a plurality of metal layers, the layer of metal being farthest removed from a substrate of the integrated circuit die.

4. The circuit identifier of claim 1 wherein said predetermined layer of the integrated circuit die is a dielectric layer.

5. The circuit identifier of claim 1 wherein said identification means is formed as a trench region in said predetermined one of the layers of the integrated circuit die.

6. The circuit identifier of claim 1 wherein said identification means is formed as a vertically raised structure by lithographically patterning and etching said predetermined one of the layers of the integrated circuit die.

7. The circuit identifier of claim 1 wherein said identification means is formed as a plurality of symbols, one of the symbols being substantially "L" shaped.

8. The circuit identifier of claim 1 wherein said identification means is formed as a plurality of symbols, one of the symbols being substantially "T" shaped.

9. The circuit identifier of claim 1 wherein said identification means is formed as a plurality of symbols, one of the symbols being substantially "V" shaped.

10. The circuit identifier of claim 1 wherein said identification means is formed either adjacent to or overlying one of the redundant circuits.

11. An integrated circuit comprising:
a substrate;
a plurality of dielectric layers overlying the substrate;
a plurality of conductive layers overlying the substrate and intermixed with the plurality of dielectric layers;
at least one circuit module formed from the plurality of dielectric layers and the plurality of conductive layer to perform a predetermined integrated circuit function, the at least one circuit module having a surface area;
a plurality of circuit cells adjacent the at least one circuit module and being electrically disconnected from the at least one circuit module, each circuit cell in the plurality of circuit cells having a surface area which is smaller than the surface area of the at least one circuit module; and
circuit identification means located adjacent a predetermined circuit cell in the plurality of circuit cells for identifying a functionality of the predetermined circuit cell, the identification means being formed by one of the conductive layers in the plurality of conductive layers, the identification means comprising a plurality of symbols wherein each symbol is a symbol within one of either a binary, ternary, or quaternary numerical system.

12. The integrated circuit of claim 11 wherein the identification means is used to determine a physical orientation of one circuit cell in the plurality of circuit cells.

13. The integrated circuit of claim 11 wherein the plurality of circuit cells are a plurality of test structures used to test the at least one circuit module.

14. The integrated circuit of claim 11 wherein the plurality of circuit cells are focused ion beam cells which are selectively connected to the at least one circuit module by a focused ion beam machine to replace or supplement a device in the at least one circuit module.

15. The integrated circuit of claim 11 wherein the plurality of conductive layers include at least one metallic layer.

16. An integrated circuit comprising:
a substrate;
a plurality of dielectric layers overlying the substrate;
a plurality of metal layers overlying the substrate and intermixed with the plurality of dielectric layers;
a plurality of circuit modules formed from the plurality of dielectric layers and the plurality of metal layers to perform a predetermined integrated circuit function, the at least one circuit module having a surface area;
a plurality of redundant focus ion beam cells adjacent a predetermined circuit module in the plurality of circuit modules and being electrically disconnected from all the circuit modules in the plurality of circuit modules, each redundant focus ion beam cell in the plurality of redundant focus ion beam cells having a surface area which is smaller than the surface area of the predetermined circuit module; and
circuit identification means located adjacent each circuit cell in the plurality of circuit cells for identifying a function and orientation of a predetermined redundant focus ion beam cell in the plurality of redundant focus ion beam cells, the identification means being formed by one of the metal layers in the plurality of metal layers, the identification means comprising at least one non-alphanumeric symbol wherein the non-alphanumeric symbol is a symbol in one of either a binary, ternary, or quaternary numerical system.

17. The integrated circuit of claim 16 wherein one focused ion beam cell is electrically coupled to a circuit module in a plurality of circuit modules by a conductive interconnect formed by a focused ion beam machine.

18. The integrated circuit of claim 16 wherein the non-alphanumeric symbol is a symbol selected from a group consisting of: an "L" shaped symbol, a "T" shaped symbol, and a "V" shaped symbol.

* * * * *